(12) United States Patent
Liu et al.

(10) Patent No.: US 8,426,720 B2
(45) Date of Patent: Apr. 23, 2013

(54) MICRO THERMOELECTRIC DEVICE AND MANUFACTURING METHOD THEREOF

(75) Inventors: Chun-Kai Liu, Taipei (TW); Jen-Hau Cheng, Taipei (TW)

(73) Assignee: Industrial Technology Research Institute, Chutung, Hsinchu (TW)

( * ) Notice: Subject to any disclaimer, the term of this patent is extended or adjusted under 35 U.S.C. 154(b) by 1753 days.

(21) Appl. No.: 10/902,004

(22) Filed: Jul. 30, 2004

(65) Prior Publication Data

US 2005/0150538 A1   Jul. 14, 2005

(30) Foreign Application Priority Data

Jan. 9, 2004   (TW) .............................. 93100495 A (51) Int. Cl.
*H01L 35/30*   (2006.01)

(52) U.S. Cl.
USPC .......................................................... 136/205

(58) Field of Classification Search .................. 136/205, 136/201, 233
See application file for complete search history.

(56) References Cited

U.S. PATENT DOCUMENTS

| | | | |
|---|---|---|---|
| 4,493,939 A | 1/1985 | Blaske et al. | |
| 4,902,648 A | 2/1990 | Ohta et al. | |
| 4,907,060 A | 3/1990 | Nelson et al. | |
| 4,946,511 A | 8/1990 | Shiloh et al. | |
| 5,006,178 A | 4/1991 | Bijvoets | |
| 5,064,476 A | 11/1991 | Recine, Sr. | |
| 5,837,929 A | 11/1998 | Adelman | |
| 5,856,210 A * | 1/1999 | Leavitt et al. | 438/55 |
| 6,207,887 B1 * | 3/2001 | Bass et al. | 136/201 |
| 6,232,542 B1 | 5/2001 | Hirashi et al. | |
| 6,278,049 B1 * | 8/2001 | Johnson et al. | 136/201 |
| 6,774,450 B2 * | 8/2004 | Inbe | 257/467 |
| 2002/0096206 A1 * | 7/2002 | Hamakawa et al. | 136/244 |
| 2002/0139410 A1 * | 10/2002 | Wilner et al. | 136/224 |
| 2003/0019216 A1 * | 1/2003 | Itakura et al. | 62/3.7 |
| 2005/0115601 A1 * | 6/2005 | Olsen et al. | 136/212 |

* cited by examiner

*Primary Examiner* — Jennifer Michener
*Assistant Examiner* — Dustin Q Dam
(74) *Attorney, Agent, or Firm* — Alston & Bird LLP (57) ABSTRACT

The present invention discloses a micro thermoelectric device and manufacturing method thereof, and the manufacturing method comprises the steps of providing a substrate and depositing a barrier layer on the substrate, using the barrier layer as a mask to etch a pattern on the barrier layer to form a plurality of openings, adopting a reactive ion etching (RIE) method to remove the barrier layer and smoothing the curvature of the corner of each groove, depositing a metal conductive wire layer, coating an adhesive layer in said each groove by a surface mount technology (SMT), placing a plurality of thermoelectric materials individually into each groove, repeating steps (a) to (f) to produce another substrate, and connecting the two substrates into an aligned position.

13 Claims, 9 Drawing Sheets

FIG.7

MICRO THERMOELECTRIC DEVICE AND MANUFACTURING METHOD THEREOF

FIELD OF THE INVENTION

The present invention relates to a micro thermoelectric device and its manufacturing method, more particularly to an inset thermoelectric device comprising an N-type semiconductor and a P-type semiconductor disposed in a highly thermal conductive grooved substrate for increasing the contact area of the thermoelectric device, and thus increasing the thermoelectric effect of the thermoelectric device and reducing the contact resistance effect to enhance the performance of the thermoelectric device.

BACKGROUND OF THE INVENTION

Thermoelectric devices are active components that provide cooling and heating effects, and their physical properties are described as follows: The ends of two wires made of different thermoelectric materials are soldered together to constitute a continuous circuit. If the ends of the wires are at different temperatures, the circuit will produce a slight voltage difference. Such phenomenon of producing electric power from heat is called the Seebeck effect.

On the other hand, the phenomenon of producing coldness from electric power when power is supplied to the foregoing circuit is called the Peltier effect. The heat at one end is absorbed and the heat on the other end is produced. The Seebeck and Peltier effects are the basic principles of thermoelectric devices.

The thermoelectric material used for thermoelectric devices has the following three properties. Firstly, the electromotive force per degree of temperature difference of the thermoelectric material, which is called the thermoelectric power of the material at the joint between components, is high.

Secondly, the thermal conductivity of the thermoelectric material is low, because if heat is conducted too quick, too large, or too small, the temperature difference will not be detected easily.

Thirdly, the electrical conductivity of the thermoelectric material is high.

The thermoelectric material is divided into two types: the N-type and the P-type defined as follows. If a current flows from the cold contact point of a thermoelectric material of a thermoelectric device made according to the Seebeck effect to other sections of the thermoelectric material, such thermoelectric material is called an N-type thermoelectric material; if the current flows into the cold contact point, then it is called a P-type material. A pair comprised of a P-type material and an N-type material is called a couple.

To improve the thermoelectric conversion efficiency, the selection and manufacture of thermoelectric materials are very important. The common thermoelectric materials such as bismuth-selenide alloy and antimony telluride, etc. having high thermoelectric conversion efficiencies are extensively used in thermoelectric modules; and thermoelectric alloys having higher efficiency and more complicated compositions are being developed.

In addition, the factors such as the adhesive strength and the stability of material used in the manufacturing process also affect the efficiency and reliability of thermoelectric modules. Therefore, it is necessary to select a stable manufacturing process.

At present, most thermoelectric devices are made manually as disclosed in the U.S. Pat. Nos. 4,907,060, 4,946,511, and 5,006,178. The N-type and P-type thermoelectric materials are slid into cubes of about 1 cubic millimeter, and a manual clamping tool is used to put a cube between two ceramic plates with solder, and then an adhesive substance is heated to adhere the cube between the ceramic plates.

Further, a method of automatically fabricating a thermoelectric device disclosed in the U.S. Pat. No. 4,493,939 mainly uses a vacuum chunk to separately put the N-type and P-type materials into the container having a plurality of orifices, and then the container is placed on the substrate, and then the container with orifices is removed. Finally, the N-type and P-type materials are adhered to the substrate by using the soldering reflow.

The U.S. Pat. No. 4,902,648 disclosed a method for improving the yield of manufacturing thermoelectric devices. The invention mainly manufactures the electrodes first, and then places the N-type semiconductor and the P-type semiconductor separately onto the electrodes one at a time, and finally adheres the two electrodes.

The U.S. Pat. No. 6,232,542 disclosed another method of manufacturing thermoelectric devices. The invention forms grooves on two thermoelectric blocks by lithographic exposures, and then combines the blocks to produce the thermoelectric device.

The U.S. Pat. No. 5,837,929 further disclosed another technology of manufacturing thermoelectric devices. The invention places an N-type material on a semiconductor wafer, and implants the N-type thermoelectric material into a P-type semiconductor by diffusion to form an alternate thermoelectric couple, and then separates the P-type and N-type semiconductors by etching, and finally manufactures the electrodes by metal deposition.

The U.S. Pat. No. 5,064,476 further disclosed another method of manufacturing thermoelectric devices. The invention sticks a conductive protruded member onto a substrate, and then uses a structure such as a frame to place the thermoelectric material between two substrates.

The U.S. Pat. No. 5,856,210 further disclosed another method of manufacturing thermoelectric device. The invention places the N-type and P-type materials into a prepared partitioning object, and makes the metallic electrodes double-sided, and then removes the partitioning object. The partitioning object is an insulator for preventing short circuits and facilitating the installation of thermoelectric components.

In view of the description above, the prior-art thermoelectric devices and their manufacturing methods have the following shortcomings:

1. All thermoelectric materials and substrates have one-sided surface contact only, and thus the conductive effect is not good.

2. The heat conducted in a reverse direction and produced by the contact resistor between the thermoelectric materials and substrates is too high, which will affect thermal conduction effect.

3. Regardless of the manufacturing method, it is necessary to use an accessory frame for fixing the thermoelectric material, which will increase the level of difficulty for the manufacturing and increase the manufacturing cost.

4. In the manufacturing process, the thermoelectric material has to go through the alignment process. If there is a slight discrepancy, it will easily affect the reliability of the components, and thus will lower the stability of the component manufacturing process.

SUMMARY OF THE INVENTION

In view of the shortcomings of the prior art as described above, a micro thermoelectric device and its manufacturing method according to the present invention are provided to overcome the shortcomings. The primary objective of the present invention is to adopt an inset structure to increase the contact area of the thermoelectric material and the substrate and enhance the thermal conduction effect of the micro thermoelectric device.

The secondary objective of the invention is to provide a micro thermoelectric device and its manufacturing method, which reduces the heat, conducted in a reverse direction and produced by the contact resistor between the thermoelectric material and the substrate, and further enhances the thermal conduction effect of the micro thermoelectric device.

Another objective of the invention is to provide a micro thermoelectric device and its manufacturing method, which uses a flip chip packaging process to manufacture the micro thermoelectric device to simplify the manufacturing procedure and automate the assembling and production in order to shorten the manufacturing time, lower the cost, and improve the yield rate.

A further objective of the invention is to provide a micro thermoelectric device and its manufacturing method, which facilitates the alignment to increase the component reliability and further improve the stability of the component manufacturing process.

Another further objective of the invention is to provide a micro thermoelectric device and its manufacturing method, which can be used for packaging integrated circuits with high heat generation and optoelectronic systems such as a stacked chip packaging, a transceiver, an arrayed waveguide grating, and a biochip, etc.

To achieve the foregoing objectives, the present invention provides a micro thermoelectric device and its manufacturing method, and the micro thermoelectric device comprises: a first substrate, having a first surface, a plurality of first grooves disposed on the first surface; a first metal conductive wire layer disposed on the first surface; a second substrate, having a second surface corresponding to the first surface and the second surface having a plurality of second grooves corresponding to the plurality of first grooves respectively; a second metal conductive wire layer disposed on the second surface; a plurality of adhesive layers disposed between the first metal conductive wire layer and the second metal conductive wire layer; a plurality of thermoelectric materials, each being inseted separately into the first grooves and second grooves; wherein the first grooves and second grooves could be in a cubic shape, a spherical shape, or any other shape, and each of the thermoelectric materials inseted into the grooves is corresponsive to the shape of each of the grooves.

DESCRIPTION OF THE PREFERRED EMBODIMENT

To make it easier for our examiner to understand the objective of the invention, its structure, innovative features, and performance, we use a preferred embodiment together with the attached drawings for the detailed description of the invention.

Please refer to FIG. 1 for the implementation steps according to the first preferred embodiment of the present invention.

Figure 1A:
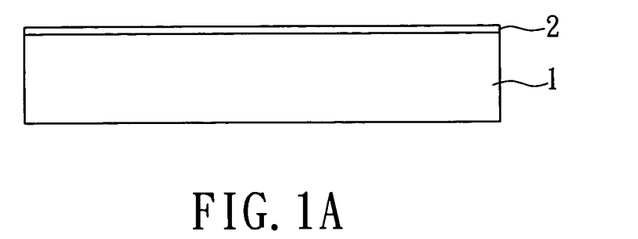
FIGS. 1A to 1H are sectional views of the implementation steps according to a preferred embodiment of the present invention.

(a) In FIG. 1A, a first substrate 1 is provided, which could be made of silicon wafer, glass, plastic, or other etchable materials, and a layer of silicon nitride ($Si_3N_4$) of about 3000 Å thick is deposited by a low pressure chemical vapor disposition (LPCVD) method to act as a barrier layer 2, and the barrier layer 2 serves as an etching barrier layer required for the anisotropic etching.

Figure 1B:
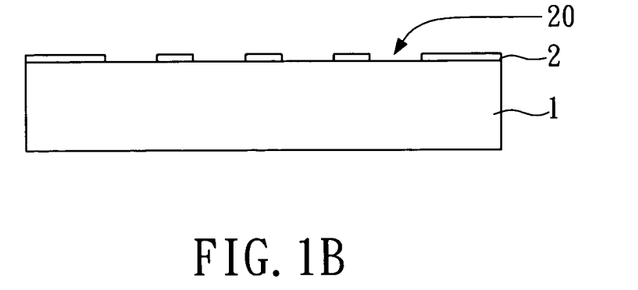

(b) In FIG. 1B, the reactive ion etching (RIE) method is used to etch the pattern of the barrier layer 2 to form a plurality of openings 20.

Figure 1C:
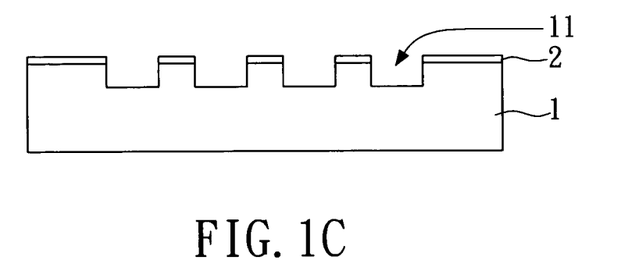

(c) In FIG. 1C, a bulk-micromachine uses the barrier layer 2 as the mask and the potassium hydroxide (KOH) as the etching liquid to perform the anisotropic etching for the first substrate 1. The plurality of etched cubic first grooves 11 is used for accommodating the thermoelectric materials.

Figure 1D:
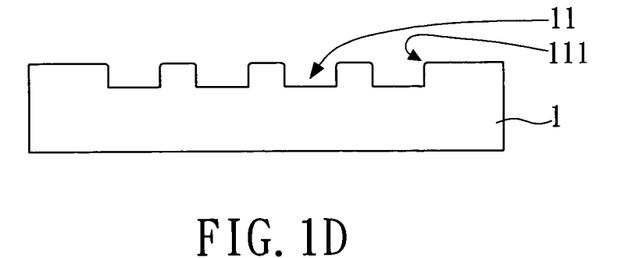

(d) In FIG. 1D, the reactive ion etching method is used to remove the barrier layer 2 and smooth the curvature of the corner 111 of the cubic first groove 11 to prevent the pointed effect.

Figure 1E:
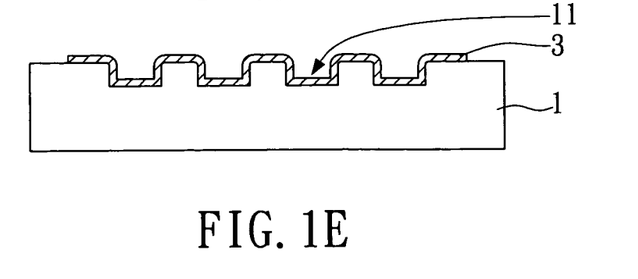

(e) In FIG. 1E, two different methods can be used to deposit a first metal conductive wire layer 3 for the electrical connection. One method is to deposit an aluminum conductive wire by sputtering, and plate a nickel on the aluminum conductive wire by a plating-free method, and finally plate a metal layer (an anti-oxidant layer for preventing the oxidation of the nickel layer) to form a first metal conductive wire layer 3. The other method is to deposit an aluminum conductive wire by sputtering to form a first metal conductive layer 3.

Figure 1F:
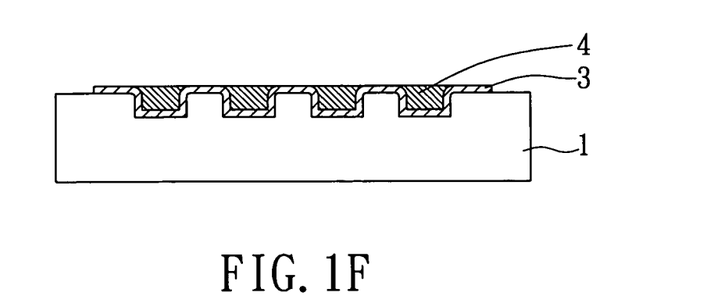

(f) In FIG. 1F, a tin material or a silver paste is spread around the cubic first groove 11 to form an adhesive layer 4 for fixing the joint of the adhesion.

Figure 1G:
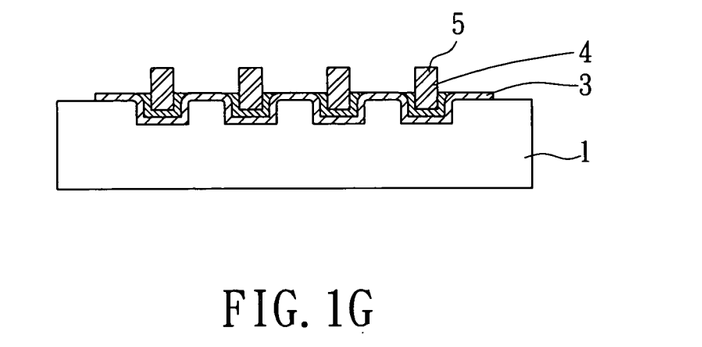

(g) In FIG. 1G, a plurality of cubic thermoelectric materials 5 is placed individually into the cubic first groove 11, wherein the cubic thermoelectric material 5 is arranged in a way such that the N-type material and the P-type material are aligned alternately, or on the opposite sides, or in other forms.

Figure 1H:
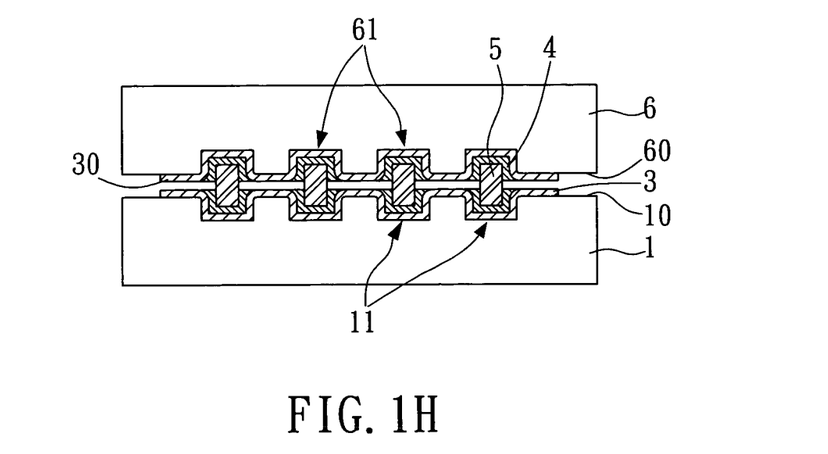

(h) In FIG. 1H, the steps depicted in FIGS. 1A to 1G are repeated to produce a second substrate 6, and a flip-chip bonder is used to connect the two opposite blocks of substrates 1, 6, which are reflowed to produce the micro thermoelectric device. The micro thermoelectric device comprises: a first substrate 1, having a first surface 10, a plurality of first grooves 11 disposed on the first surface 10; a first metal conductive wire layer 3 disposed on the first surface 10; a second substrate 6, having a second surface 60 corresponding to the first surface 10 and the second surface 60 having a plurality of second grooves 61 corresponding to the plurality of first grooves 11 respectively; a second metal conductive wire layer 30 disposed on the second surface 60; a plurality of adhesive layers 4 disposed between the first metal conductive wire layer 3 and the second metal conductive wire layer 30 in the first groove 11 and second groove 61 respectively; a plurality of thermoelectric materials 5, each being inseted separately into the first grooves 11 and second grooves 61; wherein the first grooves and second grooves are in a cubic shape.

Figure 2:
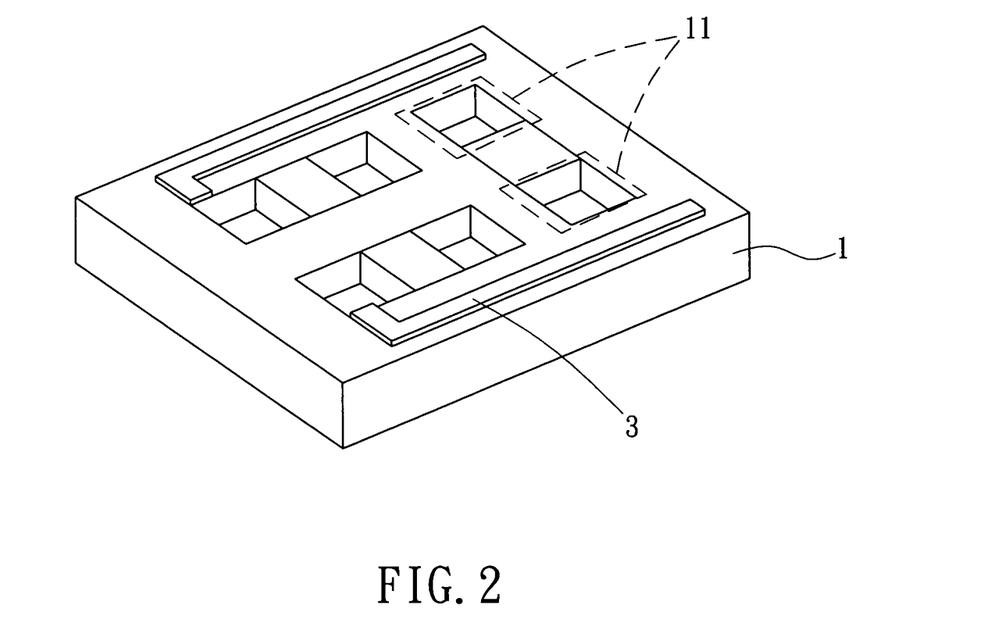
FIG. 2 is a perspective view of the substrate according to a first preferred embodiment of the present invention.
Figure 3:
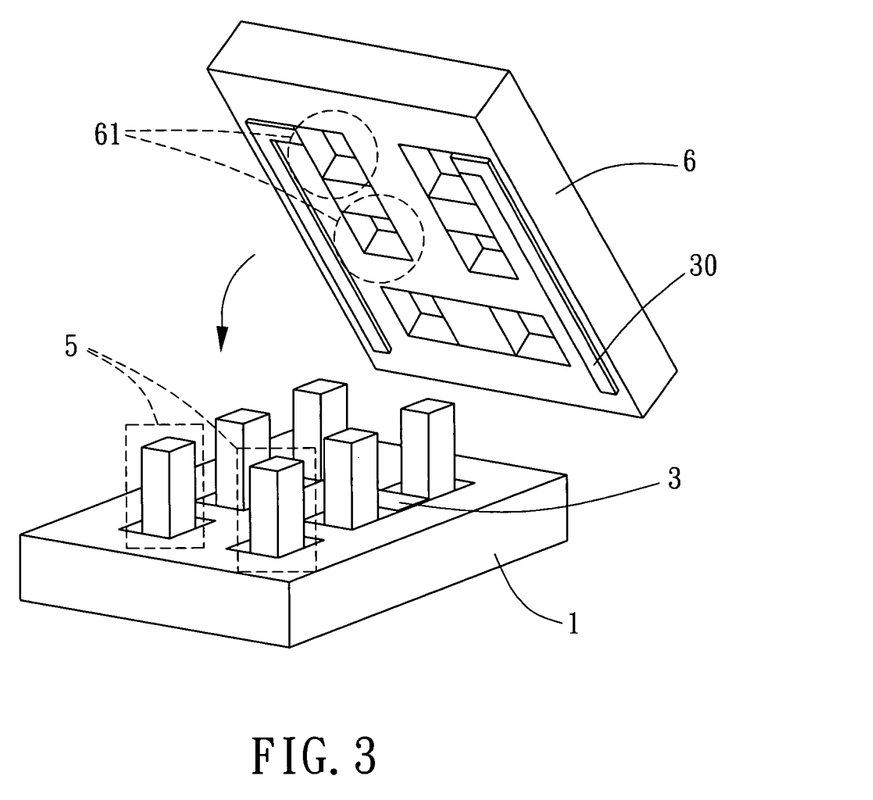
FIG. 3 is a perspective view of the inset cubic thermoelectric material according to a first preferred embodiment of the present invention.
Figure 4:
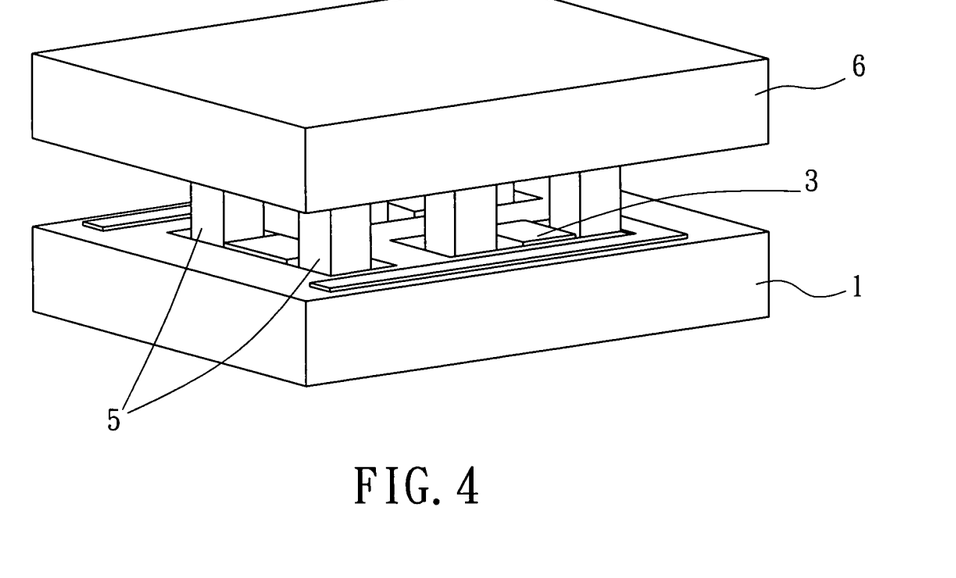
FIG. 4 is a perspective view of the structure according to a first preferred embodiment of the present invention.

Please refer to FIGS. 2, 3, and 4. The first substrate 1 has a cubic first groove 11 and the second substrate 6 has a cubic second groove 61. Since the cubic first groove 11 and the cubic second groove 61 have four more surfaces than the planar structure. From the following formula, it shows that the proportion of contact area Ac of the pin on the cubic thermoelectric material 5 and the cross-sectional area A of the cubic thermoelectric material 5 has a substantial effect on the conduction of heat. The larger the proportion, the more heat is conducted and passed through the module.

The formula for the thermal conduction of the inset thermoelectric component is given below:

$$Q_c = N\left[\alpha I \frac{A_c}{A} T_c - \frac{I^2}{2}\left(R + \frac{4r_c}{A_c}\right) - \frac{kA(T_h - T_c)}{L}\right]$$

where, the first term is the thermal conduction produced by the thermoelectric effect, primarily occurs at the contact surface of different interfaces; the second term is Joule heat, which is the heat produced by the current passing through the conductor; besides the resistance of the conductor, it also includes the heat produced by the contact resistor; the third term is the conductive heat, primarily generating the thermal conduction effect caused by the temperature difference. Therefore, the micro thermoelectric device in accordance with this invention can increase the contact area $A_C$ of the pin, such that the thermal conduction (the first term) is increased and the heat produced in the reverse direction and caused by the contact resistance (the second term) is reduced to enhance the overall thermal conduction effect.

Please refer to FIGS. 5A to 5H for the views of the implementation steps according to a second preferred embodiment of the present invention.

Figure 5A:
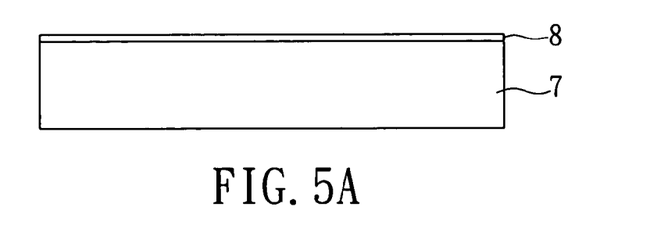
FIGS. 5A to 5H are sectional views of the implementation steps according to a second preferred embodiment of the present invention.

(a) In FIG. 5A, a first substrate 7 is provided, and the first substrate 7 could be made of silicon wafer, glass, plastic, or other etchable materials, and a layer of silicon nitride ($Si_3N_4$) of about 3000 Å thick is deposited by a low pressure chemical vapor disposition (LPCVD) method as a barrier layer 8, and the barrier layer 8 serves as an etching barrier layer required for the anisotropic etching.

Figure 5B:
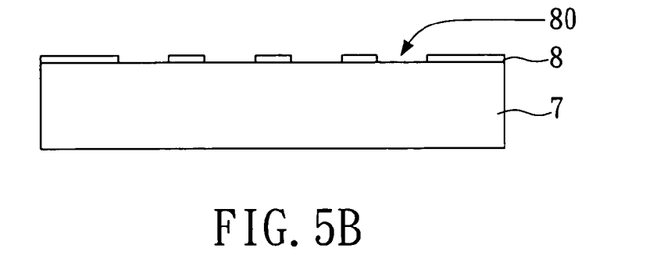
Figure 5C:
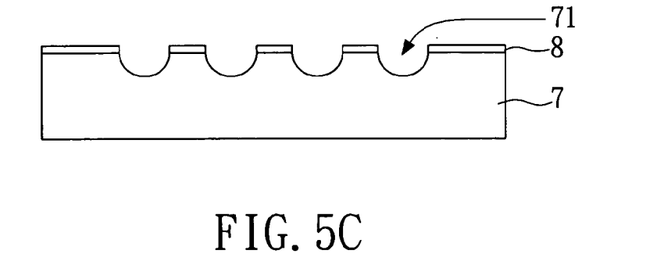

(b) In FIG. 5B, the reactive ion etching (RIE) method is used to etch the pattern of the barrier layer 8 to form a plurality of openings 80.

(c) In FIG. 1C, a bulk-micromachine uses the barrier layer 8 as the mask and the anisotropic wet hydrofluoric acid and nitric acid (HNA) etching method to etch the first substrate 7. The plurality of etched spherical first grooves 71 is used for accommodating the thermoelectric materials.

Figure 5D:
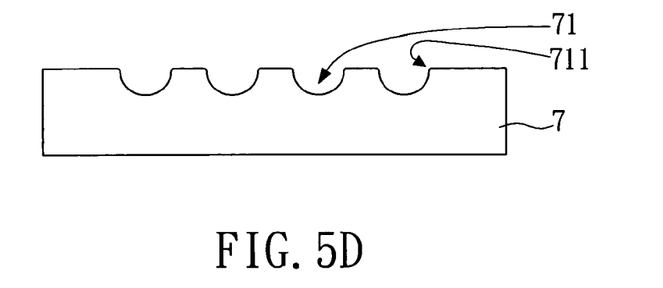

(d) In FIG. 5D, the reactive ion etching method is used to remove the barrier layer 8 and smooth the curvature of the corner 711 of the spherical first groove 71 to prevent the pointed effect.

Figure 5E:
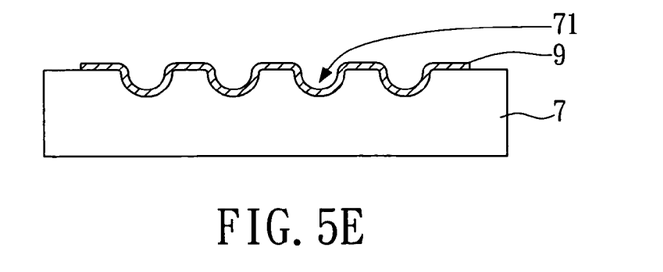

(e) In FIG. 5E, two different methods can be used to deposit a first metal conductive wire layer 9 for the electrical connection. One method is to deposit an aluminum conductive wire by sputtering, and plate a nickel on the aluminum conductive wire by a plating-free method, and finally plate a metal layer (an anti-oxidant layer for preventing the oxidation of the nickel layer) to form a first metal conductive wire layer 9. The other method is to dispose an aluminum conductive wire by sputtering to form a first metal conductive layer 9.

Figure 5F:
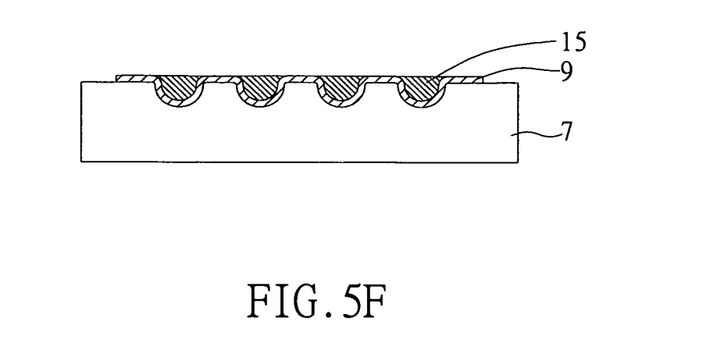

(f) In FIG. 5F, a tin material or a silver paste is spread around the cubic first groove 71 to form an adhesive layer 15 by the surface mount technology (SMT) for fixing the joint of the adhesion.

Figure 5G:
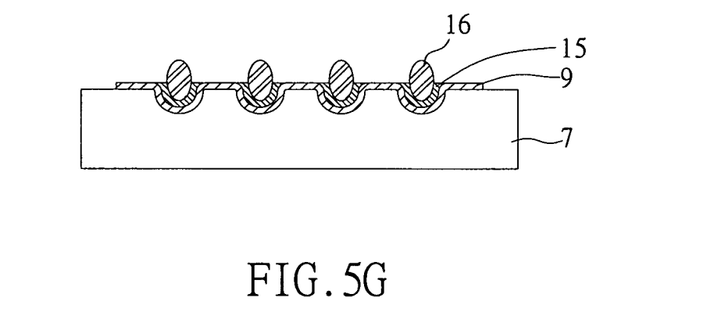

(g) In FIG. 5G, a plurality of spherical thermoelectric materials 16 is placed individually into the cubic first groove 71, wherein the cubic thermoelectric material 16 is arranged in such a way that the N-type material and the P-type material are aligned alternately, or on the opposite sides, or in other forms.

Figure 5H:
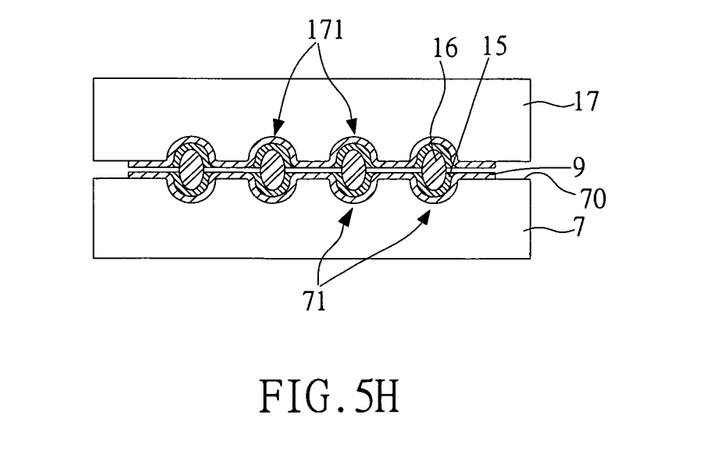

(h) In FIG. 5H, the steps depicted in FIGS. 5A to 5G are repeated to produce a second substrate 17, and a flip-chip bonder is used to join two opposite blocks of substrates 7, 17, which are reflowed to produce the whole component.

Figure 6:
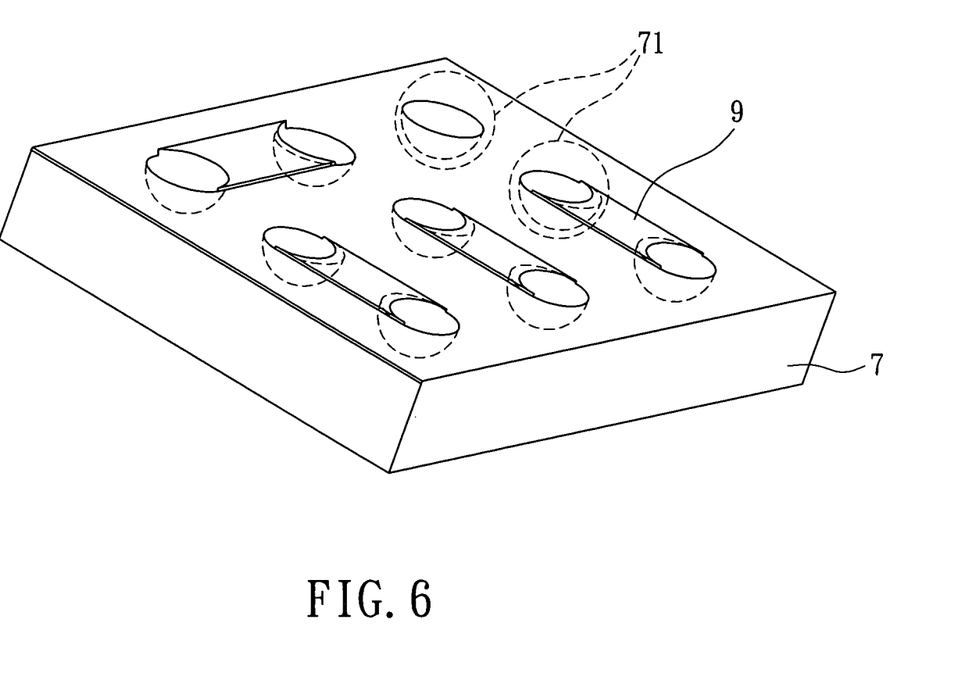
FIG. 6 is a perspective view of the substrate according to a second preferred embodiment of the present invention.
Figure 7:
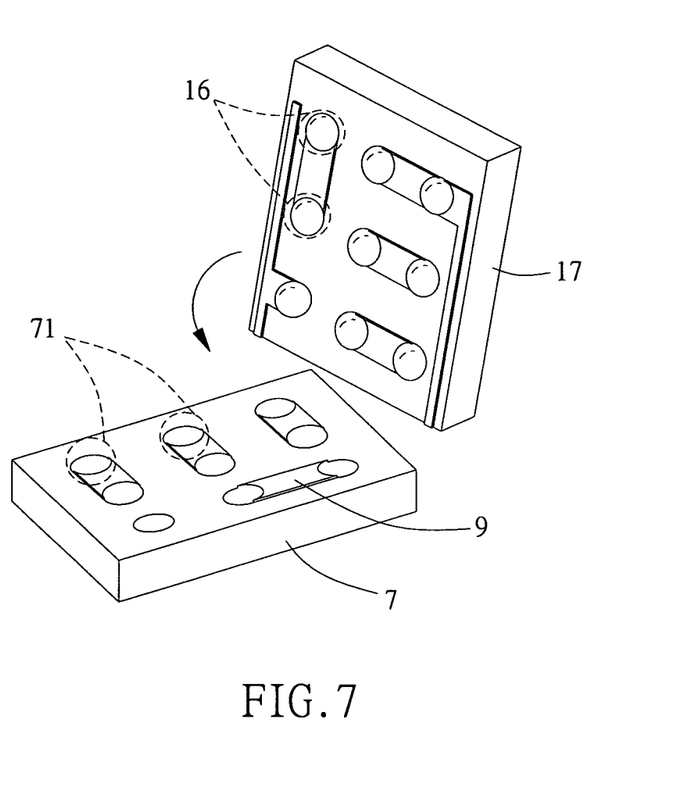
FIG. 7 is a perspective view of the inset spherical thermoelectric material according to a second preferred embodiment of the present invention.

Please refer to FIGS. 6 and 7. An isotropic etching is performed on the first substrate 7 and the second substrate 17 to form a spherical first groove 71 and a spherical second groove 171 respectively, such that the micro thermoelectric device forms an inset structure and the contact area $A_C$ of the pin of the spherical thermoelectric material 16 is larger than the planar contact area. Therefore, such arrangement can greatly improve the thermoelectric effect, and its principle has been described in previous sections, and thus will not be described here.

In the first and second preferred embodiments of the present invention described above, a plurality of groove certainly can be disposed on either the first substrate or the second substrate, and the contact area of the micro thermoelectric device can be enlarged as well, while it is employing the same principle, extra explanation will not be necessary.

In summation of the description above, the micro thermoelectric device and its manufacturing method in accordance with the invention can increase the contact area of the thermoelectric material and the substrate to improve the thermal conduction effect of the micro thermoelectric device, and also uses the current flip-chip packaging process and technology to simplify the manufacturing process and further automate the assembly and production to shorten the manufacturing time, lower the cost, improve the yield rate, and enhance the stability of the component manufacturing process.

While the preferred embodiment of the invention has been set forth for the purpose of disclosure, modifications of the disclosed embodiment of the invention as well as other embodiments thereof may occur to those skilled in the art such as changing the method of forming grooves to manufacturing by a bulk-micromachine, a semiconductor, a precision machinery, or any other manufacturing method that can produce the desired shape, or adopting other methods for the assembling, or using other conductive wires or adhesive materials instead. Accordingly, the appended claims are intended to cover all embodiments which do not depart from the spirit and scope of the invention.

What is claimed is:
1. A micro thermoelectric device, comprising:
a first substrate, having a first major surface and a plurality of first grooves defined in said first major surface, each of the first grooves including a first interior sidewall and a first bottom surface;
a first continuous metal conductive wire layer, disposed on said first major surface and covering at least the first interior sidewall and the first bottom surface of each of said first grooves and at least a portion of the major surface between the first grooves;
a second substrate, having a second major surface corresponding to said first major surface, the second major surface defining a plurality of second grooves, each of which corresponds to a respective one of said plurality of first grooves;

a second continuous metal conductive wire layer, disposed on said second major surface and covering each of said second grooves;

a plurality of adhesive layers, individually disposed in said first grooves and said second grooves;

a plurality of thermoelectric materials, each of which is disposed within a respective, corresponding pair of said first grooves and said second grooves.

2. The micro thermoelectric device of claim 1, wherein said first grooves and said second grooves are in a cubic shape.

3. The micro thermoelectric device of claim 1, wherein said thermoelectric material is in a cubic shape.

4. A micro thermoelectric device, comprising:

a first substrate, having a first major surface and a plurality of first grooves defined in said first major surface, each of the first grooves including a first singular continuous interior surface;

a first continuous metal conductive wire layer, disposed on said first major surface and covering at least a portion of the first singular continuous interior surface of each of said first grooves and at least a portion of the major surface between the first grooves;

a second substrate, having a second major surface corresponding to said first major surface, the second major surface defining a plurality of second grooves, each of which corresponds to a respective one of said plurality of first grooves;

a second continuous metal conductive wire layer, disposed on said second major surface and covering each of said second grooves;

a plurality of adhesive layers, individually disposed in said first grooves and said second grooves;

a plurality of thermoelectric materials, each of which is disposed within a respective, corresponding pair of said first grooves and said second grooves, wherein at least a pair of said first grooves and respective said second grooves are in a semi-spherical shape.

5. The micro thermoelectric device of claim 4, wherein said thermoelectric material is in a spherical shape.

6. A micro thermoelectric device, comprising:

a first substrate and a second substrate, at least one of said first and second substrate comprising a major surface and a plurality of grooves defined in the major surface, at least one of the plurality of grooves including an interior sidewall and a bottom surface;

a first continuous conductive wire layer, disposed on the surface of said first substrate and second substrate, and covering at least the interior sidewall and the bottom surface of the groove and at least a portion of the major surface between the adjacent grooves;

a plurality of adhesive layers, individually disposed in each of said grooves;

a plurality of thermoelectric materials disposed within said grooves.

7. The micro thermoelectric device of claim 6, wherein said grooves are in a cubic shape.

8. The micro thermoelectric device of claim 6, wherein said thermoelectric material is in a cubic shape.

9. A micro thermoelectric device, comprising:

a first substrate and a second substrate, at least one of said first and second substrate comprising a major surface and a plurality of grooves defined in the major surface, at least one of the plurality of grooves including a singular continuous interior surface;

a metal continuous conductive wire layer, disposed on surfaces of said first substrate and second substrate, and covering at least a portion of the singular continuous interior surface of the groove and at least a portion of the major surface between the adjacent grooves;

a plurality of adhesive layers, individually disposed in each of said grooves;

a plurality of thermoelectric materials disposed within said grooves.

10. The micro thermoelectric device of claim 9, wherein said thermoelectric material is in a spherical shape.

11. The micro thermoelectric device of claim 1, wherein each of the second grooves includes a second interior sidewall and a second bottom surface, and the second continuous metal conductive wire layer is disposed on said second major surface and covers at least the second interior sidewall and the second bottom surface of each of the second grooves and at least a portion of the major surface between the second grooves.

12. The micro thermoelectric device of claim 4, wherein each of the second grooves includes a second continuous interior surface, the second continuous metal conductive wire layer covers at least the second continuous interior surface of each of said second grooves and at least a portion of the major surface between the second grooves.

13. The micro thermoelectric device of claim 9, wherein at least a pair of said first grooves and respective said second grooves are in a semi-spherical shape.

* * * * *